United States Patent [19]
Staples

[11] Patent Number: 6,009,151
[45] Date of Patent: Dec. 28, 1999

[54] PC CARD MODEM WITH MICROPHONE AND SPEAKER CONNECTIVITY

[75] Inventor: Leven E. Staples, Granbury, Tex.

[73] Assignee: Data Race, Inc., San Antonio, Tex.

[21] Appl. No.: 08/703,444

[22] Filed: Aug. 27, 1996

[51] Int. Cl.⁶ .................................................. H04M 11/00
[52] U.S. Cl. ................................... 379/90.01; 370/93.05; 370/110.01
[58] Field of Search ............................... 379/90.1, 93.05, 379/93.07, 93.14, 93.15, 93.23, 93.37, 110.01; 370/58.1; 365/164; 395/882, 884

[56] References Cited

U.S. PATENT DOCUMENTS

| | | |
|---|---|---|
| 4,578,537 | 3/1986 | Faggin et al. . |
| 4,597,077 | 6/1986 | Nelson et al. . |
| 4,614,144 | 9/1986 | Sagara et al. . |
| 4,679,191 | 7/1987 | Nelson et al. . |
| 4,750,171 | 6/1988 | Kedar et al. . |
| 4,916,607 | 4/1990 | Teraichi et al. . |
| 4,972,457 | 11/1990 | O'Sullivan . |
| 4,979,144 | 12/1990 | Mizuta . |
| 5,136,631 | 8/1992 | Einhorn et al. . |
| 5,192,999 | 3/1993 | Graczyk et al. . |
| 5,274,738 | 12/1993 | Daly et al. . |
| 5,297,231 | 3/1994 | Miller . |
| 5,317,630 | 5/1994 | Feinberg et al. . |

(List continued on next page.)

OTHER PUBLICATIONS

Anderson, D., PCMCIA System Architecture, Mindshare, Inc., 1994, pp. 1–50.

Bryan, John, "PCMCIA: Past, Present and Promise," *Byte*, pp. 65–72, Nov. 1994.

Rigney, Steve, "Socket to Us: PCMCIA Connectivity," *PC Magazine*, pp. 207–212, Jan. 24, 1995.

Nass, Richard, ("Nass I"), "PCMCIA Fax–Modem and LAN Run Simultaneously," *Electronic Design*, pp. 131–132, Oct. 3, 1994.

Nass, Richard, ("Nass I"), "Multifunction Cards Pose Design Challenges," Electronic Design, pp. 51–53, Oct. 3, 1994.

*Primary Examiner*—Curtis A. Kuntz
*Assistant Examiner*—Melur Ramakrishnaiah
*Attorney, Agent, or Firm*—Conley, Rose & Tayon; Robert C. Kowert; Jeffrey C. Hood

[57] ABSTRACT

The present invention comprises a PC Card adapted for insertion in a PC Card slot in a computer system. The PC Card includes a housing having a PC Card adapter having a plurality of input and output pins for coupling the housing to the PC Card slot and receiving and transmitting signals in said computer system. A microphone is disposed within said housing, as is audio interface logic coupled to the microphone. The audio interface logic is configured to process audio signals from the microphone across said PC Card adapter. The PC card further includes a modem coupled to a connector defining an external communication path and configured to receive telephony signals, and telephone answering logic operably coupled to the modem and audio interface logic and configured to receive telephony signals from the modem and to store data corresponding to the telephony signals. The PC Card further includes speakerphone logic configured to provide speakerphone functionality to the PC Card. In one embodiment, the PC Card also includes a speaker configured to provide an audio output. The audio interface logic interfaces the microphone and/or speaker to the PC Card and the telephone answering and speakerphone logic. In alternate embodiments, the PC Card provides for external microphone and/or speaker connectivity.

30 Claims, 9 Drawing Sheets

U.S. PATENT DOCUMENTS

| | | | |
|---|---|---|---|
| 5,333,266 | 7/1994 | Boaz et al. . | |
| 5,335,276 | 8/1994 | Thompson et al. . | |
| 5,349,640 | 9/1994 | Dunn et al. . | |
| 5,353,334 | 10/1994 | O'Sullivan . | |
| 5,361,061 | 11/1994 | Mays et al. . | |
| 5,392,223 | 2/1995 | Caci . | |
| 5,408,614 | 4/1995 | Thornton et al. . | |
| 5,411,405 | 5/1995 | McDaniels et al. . | |
| 5,420,852 | 5/1995 | Anderson et al. | 370/58.1 |
| 5,423,697 | 6/1995 | MacGregor . | |
| 5,426,564 | 6/1995 | Hsu . | |
| 5,428,663 | 6/1995 | Grimes et al. . | |
| 5,437,019 | 7/1995 | Brockmann . | |
| 5,440,585 | 8/1995 | Patridge, III . | |
| 5,444,768 | 8/1995 | Lemaire et al. | 379/93.01 |
| 5,444,869 | 8/1995 | Stricklin et al. . | |
| 5,445,525 | 8/1995 | Broadbent et al. . | |
| 5,457,782 | 10/1995 | Daly et al. . | |
| 5,463,742 | 10/1995 | Kobayashi . | |
| 5,471,470 | 11/1995 | Sharma et al. . | |
| 5,475,691 | 12/1995 | Chapman et al. . | |
| 5,481,616 | 1/1996 | Freadman . | |
| 5,483,530 | 1/1996 | Davis et al. . | |
| 5,509,811 | 4/1996 | Homic . | |
| 5,515,423 | 5/1996 | Beck et al. . | |
| 5,517,646 | 5/1996 | Piccirillo et al. . | |
| 5,519,641 | 5/1996 | Beers et al. . | |
| 5,524,047 | 6/1996 | Brown et al. . | |
| 5,526,408 | 6/1996 | Yekutiely . | |
| 5,574,682 | 11/1996 | Shinohara | 365/164 |
| 5,602,902 | 2/1997 | Satterlund et al. . | |
| 5,606,599 | 2/1997 | O'Mahoney et al. . | |
| 5,701,515 | 12/1997 | Gradeler | 395/884 |
| 5,752,082 | 5/1998 | Staples | 395/882 |
| 5,799,036 | 8/1998 | Staples . | |
| 5,812,870 | 9/1998 | Kikinis et al. | 395/800.32 |
| 5,822,692 | 10/1998 | Krishan et al. | 455/557 |

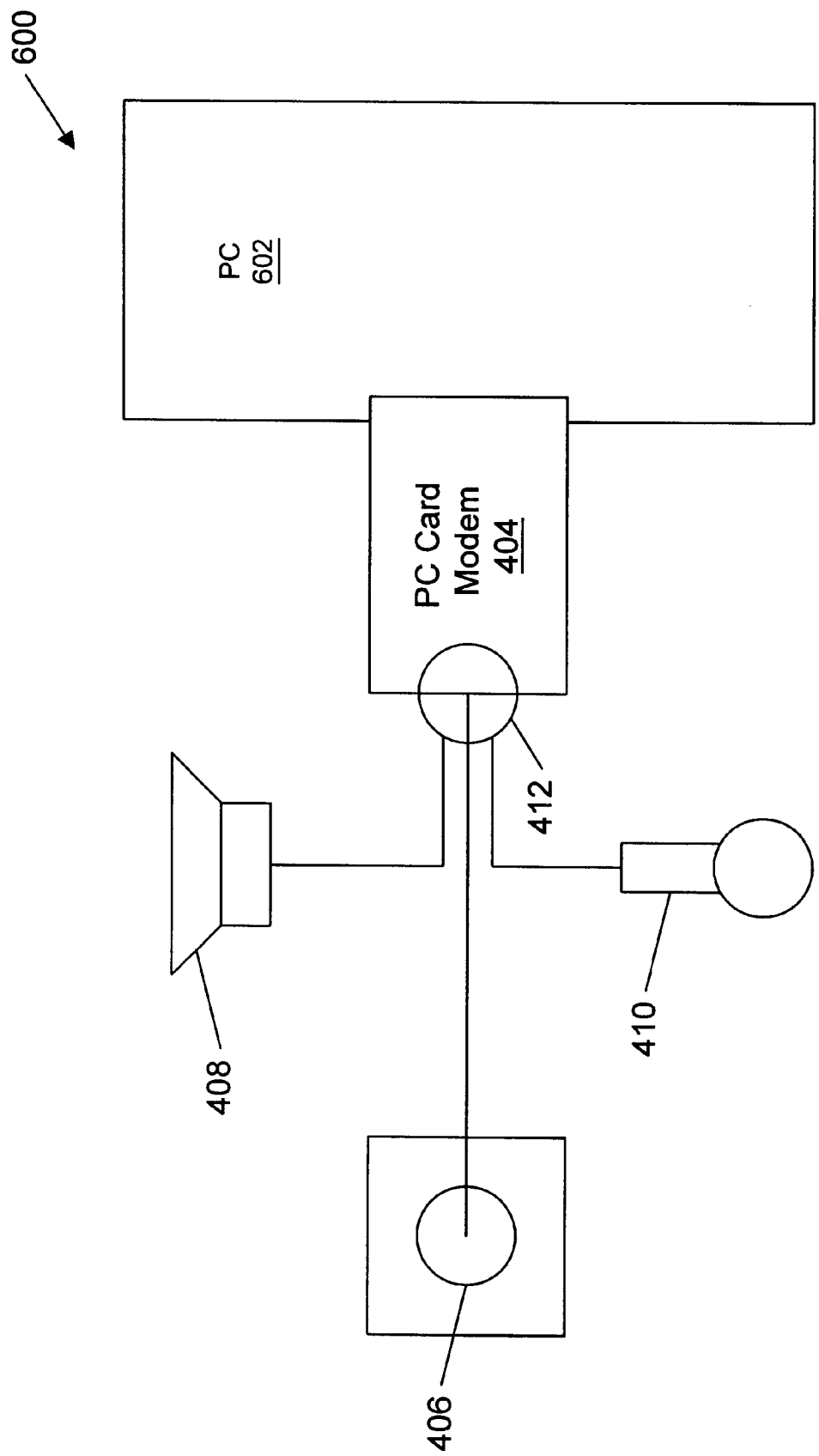

PC CARD MODEM WITH MICROPHONE AND SPEAKER CONNECTIVITY

CROSS REFERENCE TO RELATED APPLICATIONS

This is a continuation-in-part of U.S. patent application Ser. No. 08/496,537 entitled "Computer System Which Provides Analog Audio Communication Between a PC Card and the Computer's Sound System," filed on Jun. 29, 1995, whose inventor is Leven E. Staples, and U.S. patent application Ser. No. 08/544,054, entitled "Computer System Which Provides Digital Audio Communication Between a PC Card and the Computer's Sound System," filed Oct. 17, 1995, whose inventor is Leven E. Staples, both of which are assigned to Data Race Corporation.

FIELD OF THE INVENTION

The present invention relates to a computer system including digital audio communication between a sound system and a PC Card slot, wherein the computer system is adapted to receive a PC Card adapted for insertion into the PC Card slot which interfaces to the computer's sound system, and wherein the PC Card communicates digital or analog audio data with a codec or sound system inside the computer system. More particularly, the present invention relates to a PC Card device having a microphone and/or speaker connections for providing audio input/output capability.

DESCRIPTION OF THE RELATED ART

PC Cards were introduced in 1989 under the name "PCMCIA cards" according to a standard developed by the Personal Computer Memory Card International Association (PCMCIA). In 1995 the PCMCIA committee renamed the cards to "PC Cards." The principal benefit of the PC Card standard has generally been portability. The PCMCIA (Personal Computer Memory Card International Association) standard was originally developed for plug-in memory cards for portable and laptop computer systems. However, the PCMCIA standard has grown to encompass a broad array of peripheral devices, including network adapters, modems, flash memory cards, sound cards, global positioning system devices, and others.

The PCMCIA standard is not sanctioned by an official standard's body such as the IEEE (Institute of Electrical and Electronics Engineers) or ANSI (American National Standards Institute), but rather the PCMCIA specification is promulgated by the PCMCIA committee, which provides a series of recommended guidelines for the physical specification of cards, the physical and electrical specification of sockets and the interaction among system software and cards.

The PCMCIA standard requires that all PC Cards have the same length and width, this being 85.6 mm by 54 mm. The PCMCIA standard currently defines three types of PC Cards. Type I cards are limited to a thickness of 3.3 mm and are used principally as memory cards, including RAM cards, ROM cards and DRAM cards. Type II PC Cards can be up to 5.5 mm thick and are large enough to include I/O port connections, and thus most LAN (local area network) adapters and modems are type II PC Cards. Type III cards can be up to 10.5 mm thick and are typically used for products that require moving parts such as hard disks. PCMCIA PC Card slots are backwards compatible with regard to size, i.e., a type III slot also accepts type I and type II cards, but a type I slot will only receive type I cards.

The physical and electrical standards for PC Cards have evolved over time. The original PCMCIA 1.0 standard defined only type I Cards and did not define an I/O feature or software drivers. The PCMCIA 2.0 standard introduced I/O-specific cards, but did not define software driver specifications. Rather, software driver specifications were left to card manufacturers. The PCMCIA 2.1 standard introduced the use of software drivers called Card Services and Socket Services. These software driver standards helped solve many compatibility problems users experienced between different cards and slots. The PCMCIA 2.1 standard also introduced plug-and-play features such as the ability to hot swap cards without rebooting the PC.

The most recent PCMCIA PC Card standard is referred to by the PCMCIA Committee simply as the "PC Card standard" and does not include a version number. This standard includes new specifications for 32 bit bus mastering adapters, on board direct memory access (DMA), multi-function adapters, and reduced power requirements of 3.3 volts.

The PCMCIA specification also governs the driver software specification referred to as card and socket services, which determine how the cards operate. The socket services are a set of BIOS-level drivers that control the physical operation of PCMCIA sockets. Card services also coordinate the system interrupts and memory activities and handle power management tasks.

The PCMCIA standard also requires that each card connect in a PC Card adapter slot using a standard 68 pin connector. For PC Card memory devices, the pins are used primarily for address and data lines, as well as a few control lines. PC Cards configured as input/output (I/O) devices, such as a modem, network adapter, or sound card, define additional signals, including a digital speaker signal referred to as SPKR (pin 62), which provides digital audio signals to the computer system.

Computer systems are currently evolving into multimedia systems which have advanced graphics and sound capabilities. Another trend in the computer industry is the marriage of computers with telephones to create computer telephony applications. Thus a computer system may include a telephone which interfaces to a telephone line, or the computer system may implement a virtual telephone on the display screen using the computer's microphone for audio input and the computer's speaker for audio output.

One problem with the PCMCIA specification is that the specification does not allow a PCMCIA PC Card, such as a PC Card modem, to effectively communicate digital audio information directly with a computer's sound system. As noted above, the PCMCIA specification includes a digital speaker signal referred to as SPKR which provides a digital audio signal to the computer system. However, this digital speaker signal is insufficient for modern digital audio communication applications. Thus, the current PCMCIA specification does not allow for PCMCIA standard cards which support advanced digital voice or telephony applications.

U.S. patent application Ser. No. 08/496,537, titled "Computer System Which Provides Analog Audio Communication between a PC Card and the Computer's Sound System" and U.S. patent application Ser. No. 08/544,054, titled "Computer System Which Provides Digital Audio Communication Between a PC Card and the Computer's Sound System," disclose a system and method for providing analog or digital audio communication between a PC Card and the computer's sound system. This enables a PC Card to directly support various audio functions.

Therefore, a new PCMCIA PC Card is desired which adheres to the existing PCMCIA standard and is thus backwards compatible with existing devices, and which also provides audio communication between the computer's sound system and the PC Card. This would allow a PC Card modem or terminal adapter to include or perform advanced digital audio and telephony capabilities.

In addition, due to size constraints, and the above mentioned computer system audio limitations, PC Card telephony devices do not include audio connectivity options, such as speakers or microphones. Thus, certain of the flexibility and advantages of the PC Card are lost, since separate speaker and microphone units and/or connectivity to the computer's audio system must be provided. There exists a further need to provide a PC card device with audio input/output capabilities.

SUMMARY OF THE INVENTION

The present invention comprises a PC Card adapted for insertion in a PC Card slot in a computer system. The PC Card includes a housing having a PC Card adapter. The PC Card adapter includes a plurality of input and output pins for coupling to the PC Card slot and receiving and transmitting signals in said computer system. In a first embodiment, a microphone is disposed within said housing and audio interface logic is coupled to the microphone. The audio interface logic is configured to process audio signals from the microphone. In this embodiment, the PC card further includes a modem coupled to a connector defining an external communication path and configured to receive telephony signals, and telephone answering logic operably coupled to the modem and audio interface logic and configured to receive telephony signals from the modem and to store data corresponding to the telephony signals. In one embodiment, the PC Card further includes speakerphone logic configured to provide speakerphone functionality to the PC Card. In one embodiment, the PC Card also includes a speaker. The audio interface logic interfaces the microphone and/or speaker to the PC Card and the telephone answering and speakerphone logic.

In another embodiment, the present invention comprises a PC Card having a modem, telephone answering logic, and optionally speakerphone logic, and configured to receive telephony signals on a first connector. In addition, a second connector is attached whereby, in order to avoid the space constraints of the PC Card, an external microphone may be connected. In addition, an external speaker may be provided which may also be connected to the second external connector. Again, the audio interface logic interfaces the microphone and/or speaker to the telephone answering and speakerphone logic.

In still another embodiment, the present invention comprises a PC Card having a modem, telephone answering logic, and speakerphone logic, and configured to receive telephony signals on a standard telephony connector. The standard telephony connector is adapted to receive a standard telephone cable. Also provided on the cable is a connector for receiving an external microphone. Additionally or alternatively, a connector may be provided which may receive an external speaker. Audio interface logic interfaces the microphone and/or speaker to the telephone answering and speakerphone logic.

BRIEF DESCRIPTION OF THE DRAWINGS

A better understanding of the present invention can be obtained when the following detailed description of the preferred embodiment is considered in conjunction with the following drawings, in which:

FIG. 2c is a block diagram illustrating a PC Card providing audio connectivity according to another embodiment of the present invention;

DETAILED DESCRIPTION OF THE PREFERRED EMBODIMENT

Incorporation by Reference

*PCMCIA System Architecture* by Don Anderson and available from Mindshare Press, 2202 Buttercup Dr., Richardson, Tex. 75082 (214) 231-2216, is hereby incorporated by reference in its entirety.

The PCMCIA specification, including version 2.1 as well as other versions, is hereby incorporated by reference in its entirety.

U.S. patent application Ser. No. 08/496,537, titled "Computer System Which Provides Analog Audio Communication between a PC Card and the Computer's Sound System."

U.S. patent application Ser. No. 08/544,054, titled "Computer System Which Provides Digital Audio Communication Between a PC Card and the Computer's Sound System."

Computer System

Figure 1:
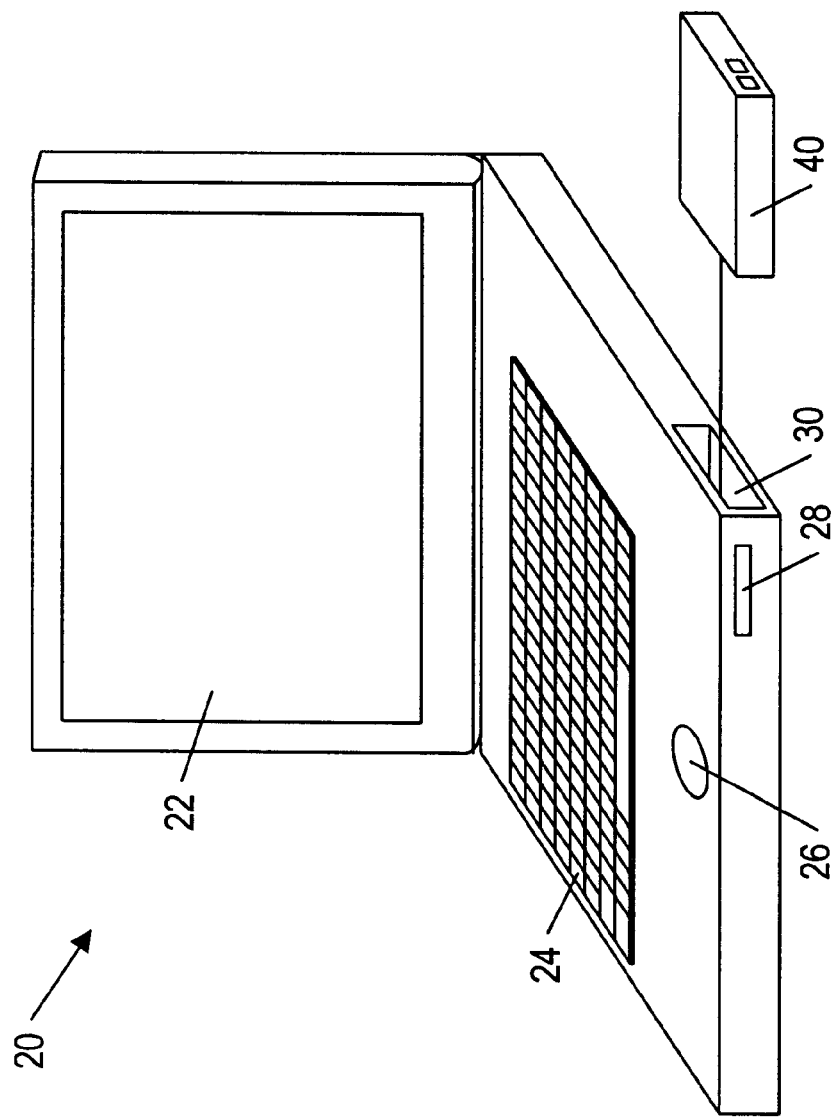
FIG. 1 illustrates a portable computer system including a PC Card Socket for receiving a PC Card according to the present invention.

Referring now to FIG. 1, a portable computer system 20 is shown which includes a PC Card socket 30, also referred to as a PCMCIA (Personal Computer Memory Card International Association) socket. The computer system 20 also includes a sound system (FIG. 6), which can include an audio digital coder/decoder (codec). The computer system 20 of FIG. 1 includes analog and/or digital audio communication between the PC Card socket 30 and the sound system according to the present invention. Thus, the computer system is adapted for receiving a PCMCIA PC Card modem or ISDN (Integrated Services Digital Network) terminal adapter having analog and/or digital audio capabilities according to the present invention. The system and method of the present invention can be incorporated into various types of computer systems which include PC Card slots, including the portable system 20 shown in FIG. 1, desk top units, and mini-tower units, as well as others.

As shown, the computer system 20 preferably includes a display screen 22, keyboard 24, mouse 26, and floppy drive 28. The computer system 20 includes components generally found in all computer systems, including a CPU, system memory, one or more buses, and various peripheral controllers and devices. The computer system 20 includes a sound system including a codec (not shown). In the present disclosure, the term sound system includes logic which transmits, processes, and/or stores audio signals, including one or more of sound logic, codecs, and other audio signal processing logic.

The computer system 20 also includes a PCMCIA host bus adapter (FIG. 2) and corresponding one or more PC Card sockets or slots 30 for receiving one or more removable PC Cards 40 as shown. According to the present invention, one or more of the PC Card sockets 30 and the sound system are connected to allow analog and/or digital audio communication, i.e., the transfer of analog or digital audio data, between the sound system and the PC Card socket 30. In the present disclosure, digital audio data preferably refers to a digitally coded representation of analog signals. However, the present invention allows various types of audio signal communication between the sound system and the PC Card socket 30.

Figure 5:
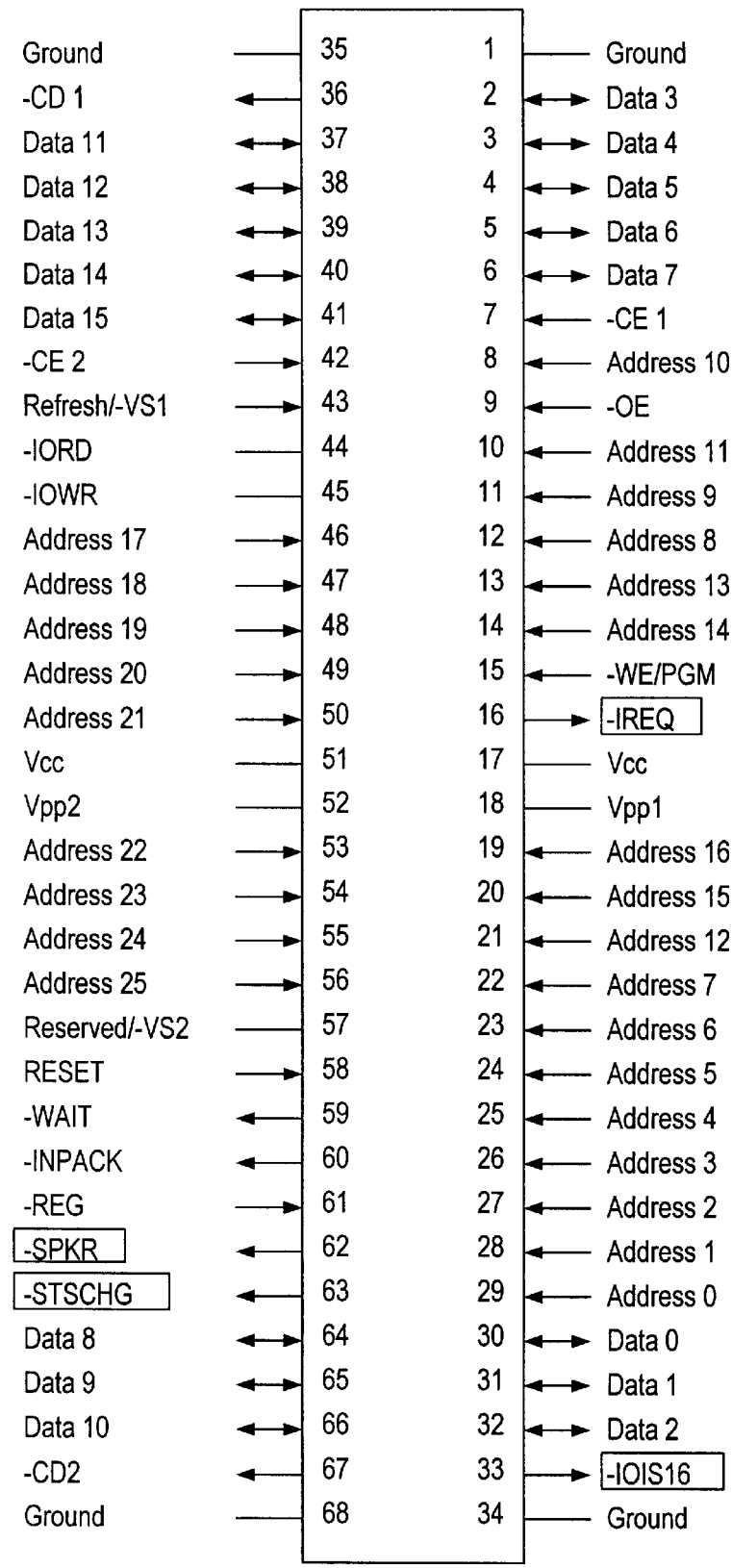
FIG. 5 illustrates pin definitions of the PC Card socket or PCMCIA I/O socket.

In the preferred embodiment the PC Card socket 30 is preferably compatible with the PCMCIA (Personal Computer Memory Card International Association) electrical specification, and includes additional signal definitions which allow digital audio communication between the computer's sound system and the PC Card 40. The pin definition of the PC Card socket is shown in FIG. 5. Thus the computer system allows operation of a PC Card modem or terminal adapter with telephone answering device (TAD) and full duplex speakerphone (FDSP) capabilities.

The PC Card 40 preferably comprises an analog modem or ISDN terminal adapter having telephone answering device and/or full duplex speakerphone capabilities according to the preferred embodiment of the present invention. As shown, the PC Card 40 is adapted for insertion into the PC Card socket or PCMCIA socket 30 in the computer system 20. The PC Card 40 is inserted into the PC Card slot 30 and can communicate digital or analog audio signals with the computer's sound system. This enables the PC Card 40 to use the computer's sound system. Thus the PC Card 40 can provide telephone answering device (TAD) and full duplex speakerphone (FDSP) capabilities by using the computer's sound system. The PC Card 40 can also use the computer's sound system to perform digital simultaneous voice and data (DSVD) communications. The PC Card 40 may comprise other functionality which performs digital and/or analog audio communication with the computer system 20. As discussed further below, the PC Card 40 includes novel audio connectivity options, such as microphone and/or speaker connections, or an embedded microphone and/or speaker.

Figure 2:
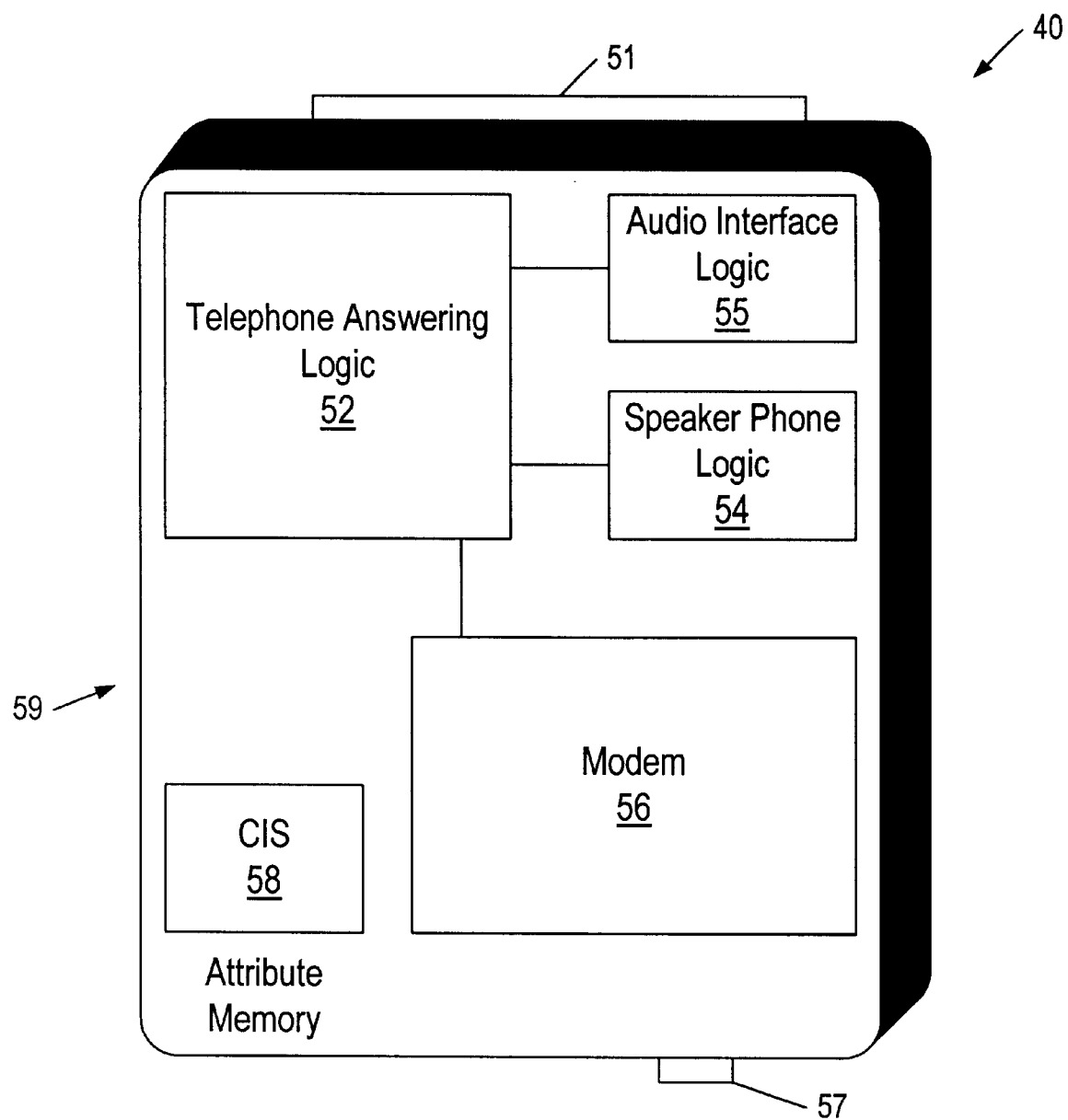
FIG. 2 illustrates a PC Card which is adapted to be inserted into the PC Card socket of FIG. 1.

PC Card Block Diagram—FIG. 2

Referring now to FIG. 2, the PC Card 40 of one embodiment is shown. The PC Card 40 preferably includes telephone answering device and/or speakerphone capabilities. As shown, the PC Card terminal adapter 40 includes a housing 59 having either a modem or an ISDN terminal adapter disposed therein. In the present disclosure, the term "modem" is intended to refer generally to a communication device, including an analog modem and an ISDN terminal adapter, among others. In the preferred embodiment, the PC Card 40 includes modem 56 which includes a connector or connectors 57 attached to housing 59 that preferably interfaces to a communication path or paths. In one embodiment, connector or connectors 57 include a standard phone jack of the RJ series and configured to receive and transmit telephony signals.

Figure 2A:
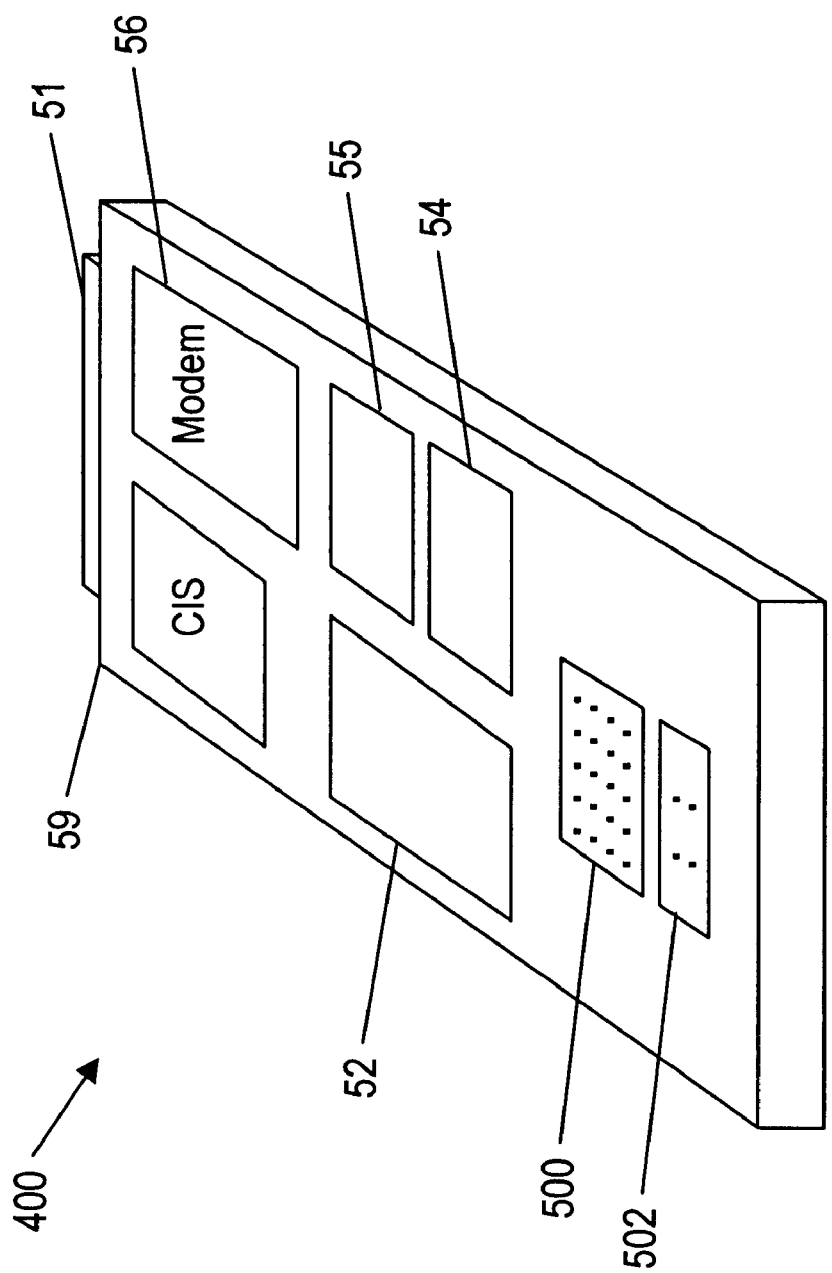
FIG. 2a illustrates a PC Card according to one embodiment of the present invention.
Figure 2B:
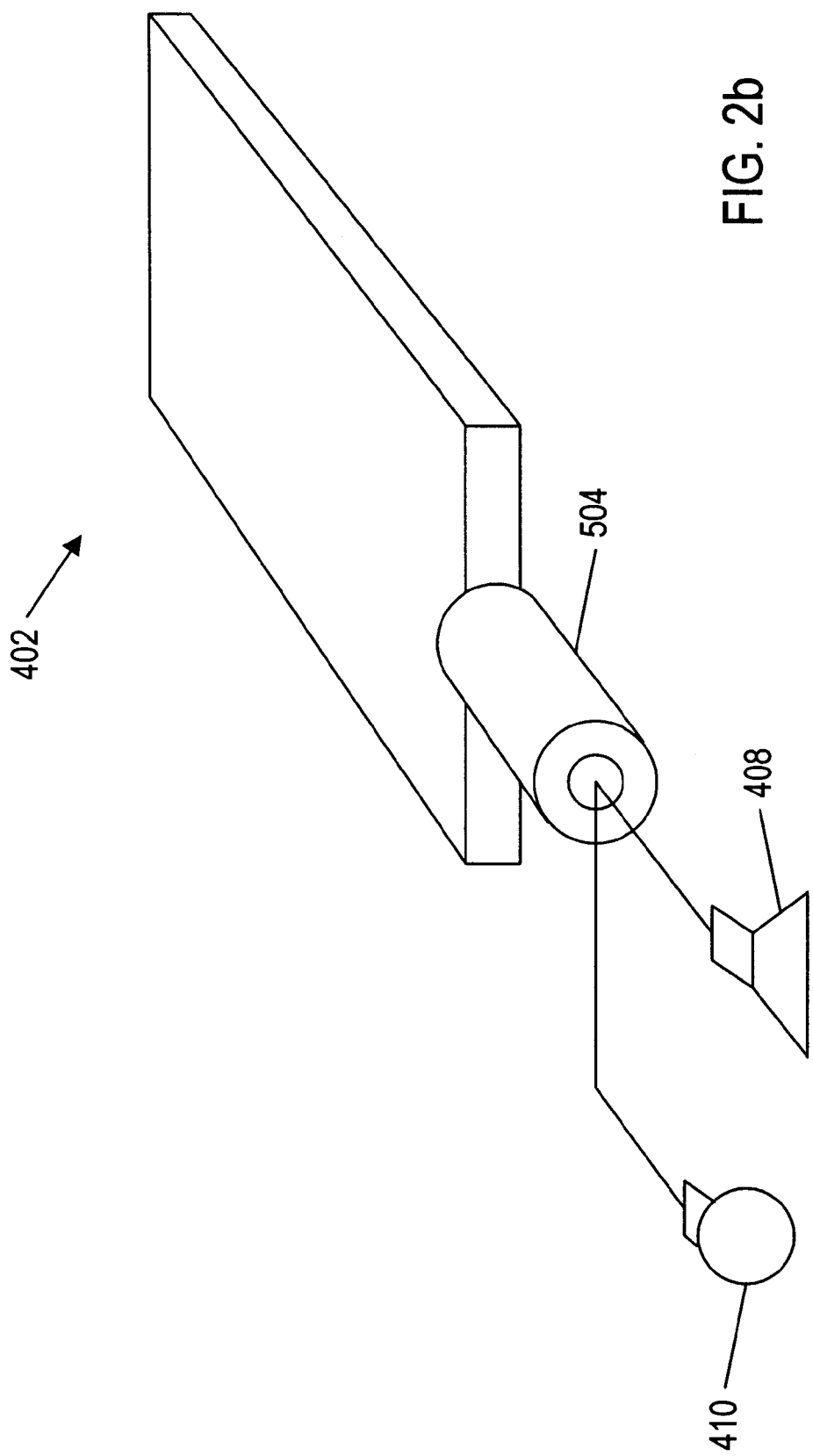
FIG. 2b illustrates a PC Card according to another embodiment of the present invention.

PC Card 40 preferably further includes microphone and/or speaker connectivity according to the present invention. As shown, PC Card 40 includes audio interface logic 55 to provide an interface for the microphone input and speaker output. Audio interface logic 55 may include, for example, an audio digital coder/decoder (codec) to provide D/A or A/D conversion capabilities. As shown in the embodiment of FIG. 2a, audio interface logic 55 includes or is coupled to an integrated speaker 500 and/or a microphone 502. More particularly, PC Card 40 includes an integrated speaker and/or microphone (FIG. 2a). Alternately, PC Card 40 includes a socket or sockets disposed on housing 59 allowing for the connection of external microphone and/or speaker (FIG. 2b). Finally, PC Card 40 may provide speaker and/or microphone connectivity via an adapter coupled to a telephone or terminal adapter interface module 412 (FIG. 2c). The PC Card modem 40 also includes telephone answering logic 52 which performs telephone answering device functions and speakerphone logic 54 which preferably performs full-duplex speakerphone functions. The PC Card 40 also includes card information structure memory which contains configuration options for the PC Card. The CIS memory 58 preferably contains information about the type, size, speed, and other information regarding the PC Card 40.

The PC Card 40 includes an adapter 51 which is adapted for mating with the PC Card socket 30. The adapter 51 includes a plurality of connectors which mate with corresponding ones of the plurality of pins comprised in the PC Card socket. In the preferred embodiment the PC Card 40 is preferably compatible with the PCMCIA (Personal Computer Memory Card International Association) electrical specification, and includes additional signal definitions which allow the PC Card 40 to perform digital audio communication with the computer system 20. This enables the PC Card 40 to operate with telephone answering device (TAD) and full duplex speakerphone (FDSP) capabilities. The PC Card 40 is also mechanically compatible with the PCMCIA specification. In alternate embodiments, the PC Card is electrically and/or mechanically compatible with JEDEC (Joint Electronic Device Engineering Council) standards and/or JEIDA (Japanese Electronics Industry Development Association) standards, among others.

When the PC Card 40 receives a telephone call via the modem or terminal adapter 56, the telephone answering logic 52 receives the analog or digital voice signals and either stores the voice data within memory within the PC Card 40, or the PC Card 40 provides digital (or analog) audio output signals to the computer system, as discussed further below. The voice signals may also be provided by the PC Card 40 to an internal or external speaker to the be heard by the user. Also, when a user desires to listen to one or more telephone messages, if the telephone answering logic 52 stores the voice data in a memory within the PC Card 40, the telephone answering logic 52 provides the digital audio output signals corresponding to the recorded voice message for audio presentation. In the embodiment shown in FIG. 2a, the audio output signal is preferably provided to the audio interface logic 55 and then to integrated speaker 500. In the embodiment of FIG. 2b, the audio output signal is preferably provided to the audio interface logic 55 and then to the external speaker. Alternately, the signal may be provided to a speaker of the computer speaker on the computer system itself. Of course, the output signal could also be provided to the PC Card 40 in the manner shown in FIG. 2c.

When the user desires to use the computer system 20 as a speakerphone, the user speaks into the microphone 502 (FIG. 2a), 503 (FIG. 2b), 410 (FIG. 2c) and these signals are provided to the audio interface logic 55 and then to the speakerphone logic 54 to the PC sound system and back to the PC Card and out terminal adapter 56, out to the communication path, preferably a phone line. Also, analog or digital audio signals received by the terminal adapter or modem 56 are provided through the speakerphone logic 54 to the audio interface logic 55, and ultimately to the one or more speakers of the PC Card.

More particularly, turning now to FIG. 2a there is shown a PC Card 400 employing a built in microphone 502 and speaker 500. Microphone 502 and speaker 500 are preferably disposed at least partially within the housing 59 of the PC Card. It is further noted that alternate embodiments may be configured with one or the other of a microphone or a speaker. Components which correspond to those already described in FIG. 2 retain the same reference numerals. Speaker 500 and/or microphone 502 are coupled to telephone answering logic 52 and speaker phone logic 54 via audio interface logic 55. Audio input/output signals are further transferred across PC Card interface 51 to the computer sound system. It should be noted that while speaker 500 may be integrated within the PC Card, an integrated speaker may provide inadequate fidelity. Accordingly, in an alternate embodiment, microphone 502 may be incorporated within PC Card 400 while speaker 500 is coupled either through an external connector to PC Card 400 or is coupled to the computer system sound logic directly.

Turning now to FIG. 2b, there is shown yet another embodiment of a PC Card having audio input/output. More particularly. PC Card 402 includes audio input jack 504 or connector. Audio input jack or connector 504 may be adapted to receive a microphone or a speaker. FIG. 2b illustrates a speaker 408 coupled to the audio input jack 504. A microphone 410 may also be coupled to the audio input jack or connector 504. Other communication devices may be coupled to the audio input jack 504 as desired. In alternate embodiments multiple audio jacks 504 are provided; wherein each audio jack is adapted to couple to a respective individual speaker or microphone.

Turning now to FIG. 2c, there is shown yet another embodiment of the present invention. More particularly, a computer system 600 employing a PC Card modem having microphone and speaker connectivity to a telephone interface connector is shown. PC 602 includes a PC Card modem 404 coupled into a PC Card receptacle. A jack or connector 412 configured to receive a communication line, such as a standard telephone or data twisted pair wiring employing the RJ series of connectors, couples PC Card modem to an external telephone or data network 406. The PC Card modem's jack or connector 412 also includes audio plugs, adapters or connectors to interface speaker 408 and microphone 410 to the PC Card modem 404. In this embodiment, the connector jack 412 normally used for connection to the Public Switchboard Telephone Network (PSTN) comprises the connections for I/O to a microphone and/or speaker. Also, in this embodiment, the cable which includes telephone connectivity preferably includes the microphone and/or speaker cabling. Alternatively, the connectors or adapters for the microphone and/or speaker may be disposed along the length of the cable from the PC Card connector.

Figure 3:
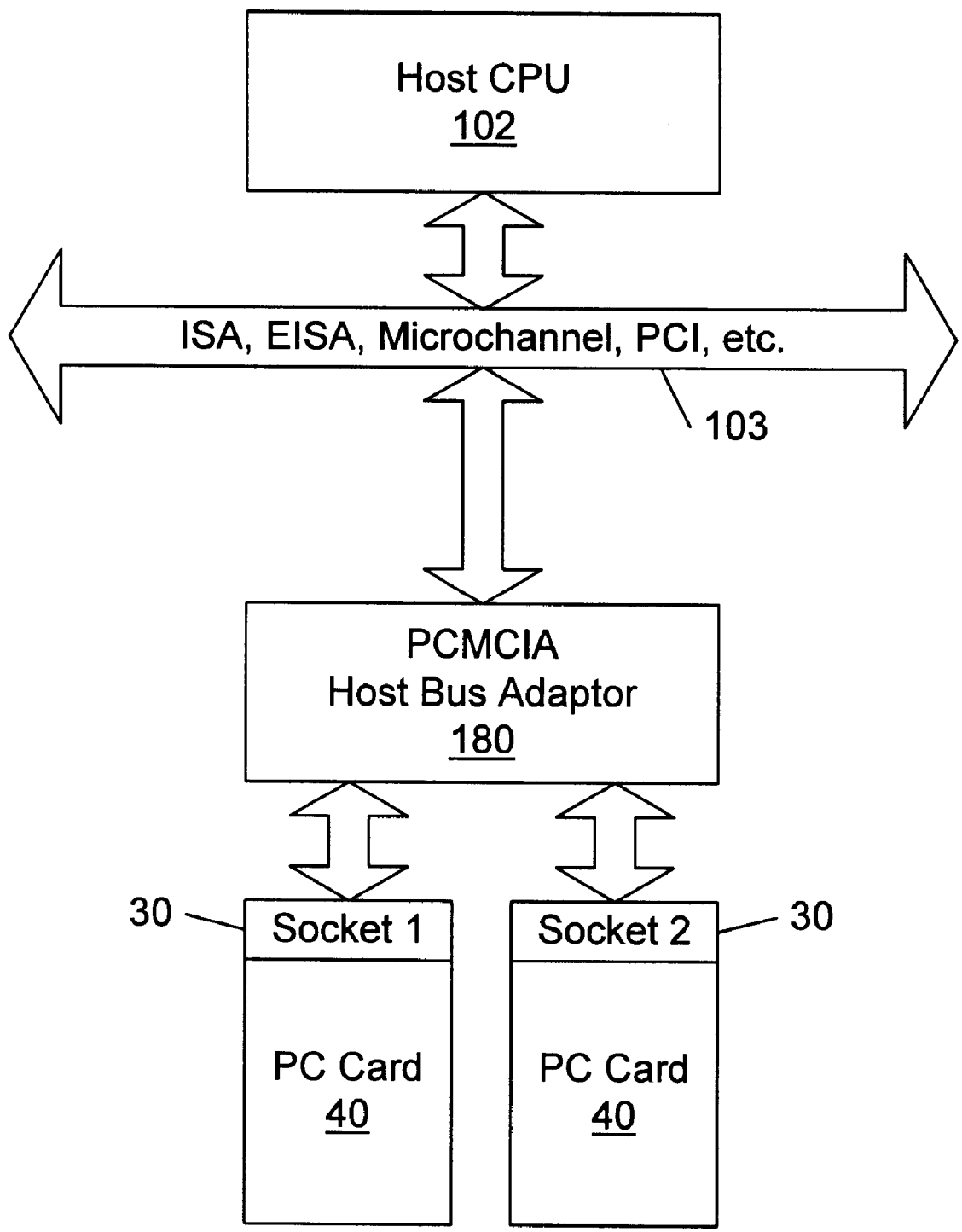
FIG. 3 is a block diagram illustrating the host CPU and PCMCIA host bus adapter architecture of the computer system of FIG. 1.
Figure 4:
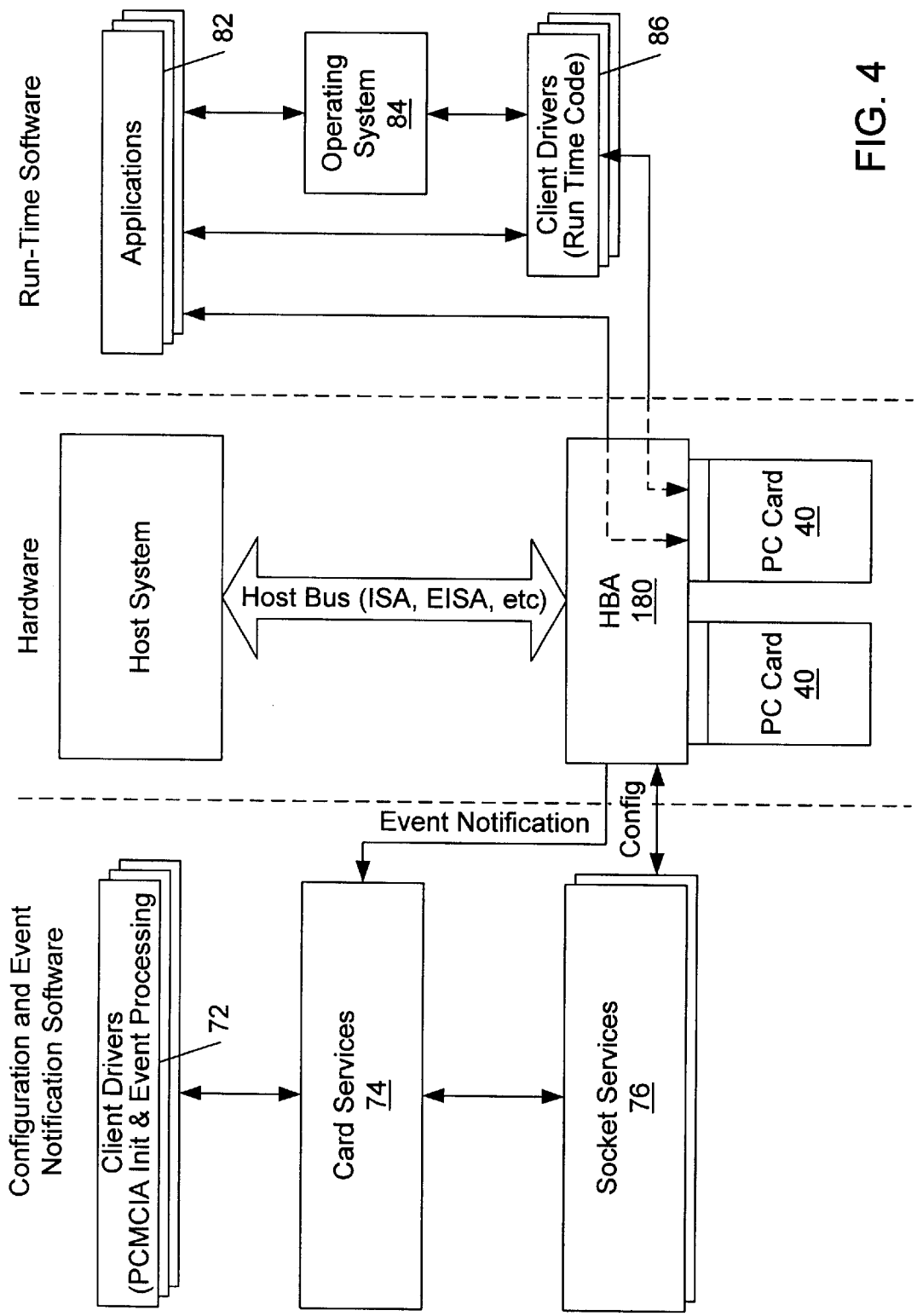
FIG. 4 illustrates hardware and software components in the computer system of FIG. 1 which interface to a PC Card.

Computer System Block Diagram—FIGS. 3–4

Referring now to FIG. 3, a block diagram illustrating the architecture of a computer system which includes one or more PC Card sockets is shown. As shown, the computer system 20 includes a host CPU 102 which interfaces to one or more expansion buses 103 within the computer system. A PCMCIA host bus adapter 180, also referred to as a PC Card bus adapter, is coupled to the one or more expansion buses 103.

The PCMCIA specification is essentially a bridge bus technology, meaning that a PC Card socket 30 developed according to the PCMCIA specification can be coupled to any number of buses or platforms. Thus the PCMCIA host bus adapter 180 can be coupled to any of various buses, including the Industry Standard Architecture (ISA) or AT expansion bus, the Extended Industry Standard Architecture (EISA) bus, the MicroChannel (MCA) bus, the PCI (peripheral component interconnect) bus, and NuBus among others.

The PCMCIA host bus adapter 180 includes the PCMCIA controller logic which interfaces between the expansion bus 103 of the computer system 20 and the removable PC Card 40. As shown, the PCMCIA host bus adapter 180 interfaces to one or more PC Card sockets 30 which are adapted for receiving PC Cards 40 as shown.

Referring now to FIG. 4, a more detailed block diagram illustrating the hardware and software components of the computer system 20 is shown. As shown, a computer system which includes a PC Card socket or PCMCIA socket 30 includes configuration software referred to as client drivers 72 which detect the presence of PC Cards 40, determine their configuration requirements, and program the PC Cards 40 for operation within the system. The PCMCIA specification includes an additional layer referred to as Card Services 74 which provide high level functions used by programmers to gain access to the PC Card 40 to determine its configuration requirements and also to request system resources. Card Services 74 perform system resource allocation for client drivers and maintain a data base in system resources that are available for assignment to PC Cards. Socket Services 76 comprise a set of BIOS-level drivers which handle the physical operations of the PC Card socket.

As shown in FIG. 4, application software executing on the host system operates in conjunction with operating system software 84 and client drivers 86 which interface to the host bus adapter 180. In the preferred embodiment of the invention, the applications software 82 includes software which facilitates the PC Card modem or terminal adapter 40 having telephone answering device and/or full duplex speakerphone capabilities.

PC Card Socket Specification

Referring now to FIG. 5, a diagram illustrating the PCMCIA specification I/O socket 30 is shown. FIG. 5 illustrates the pin definitions or signals for the PC Card socket 30 which conform to the PCMCIA specification. As shown, the PC Card socket 30 includes a plurality of address and data pins, as well as various control pins. The address pins are referred to as Address 0–Address 25.

In the preferred embodiment of the invention, the high address line pins, preferably one or more of address lines 22–25, corresponding to pins 53–56, are used to provide digital audio communication between the PC Card 40 and the sound system in the computer system 20. The PCMCIA connector 180 preferably multiplexes the digital audio signals on the high address line pins with the normal high address signals. Alternate embodiments may use various different pins to communicate the digital audio data, as desired.

Figure 6:
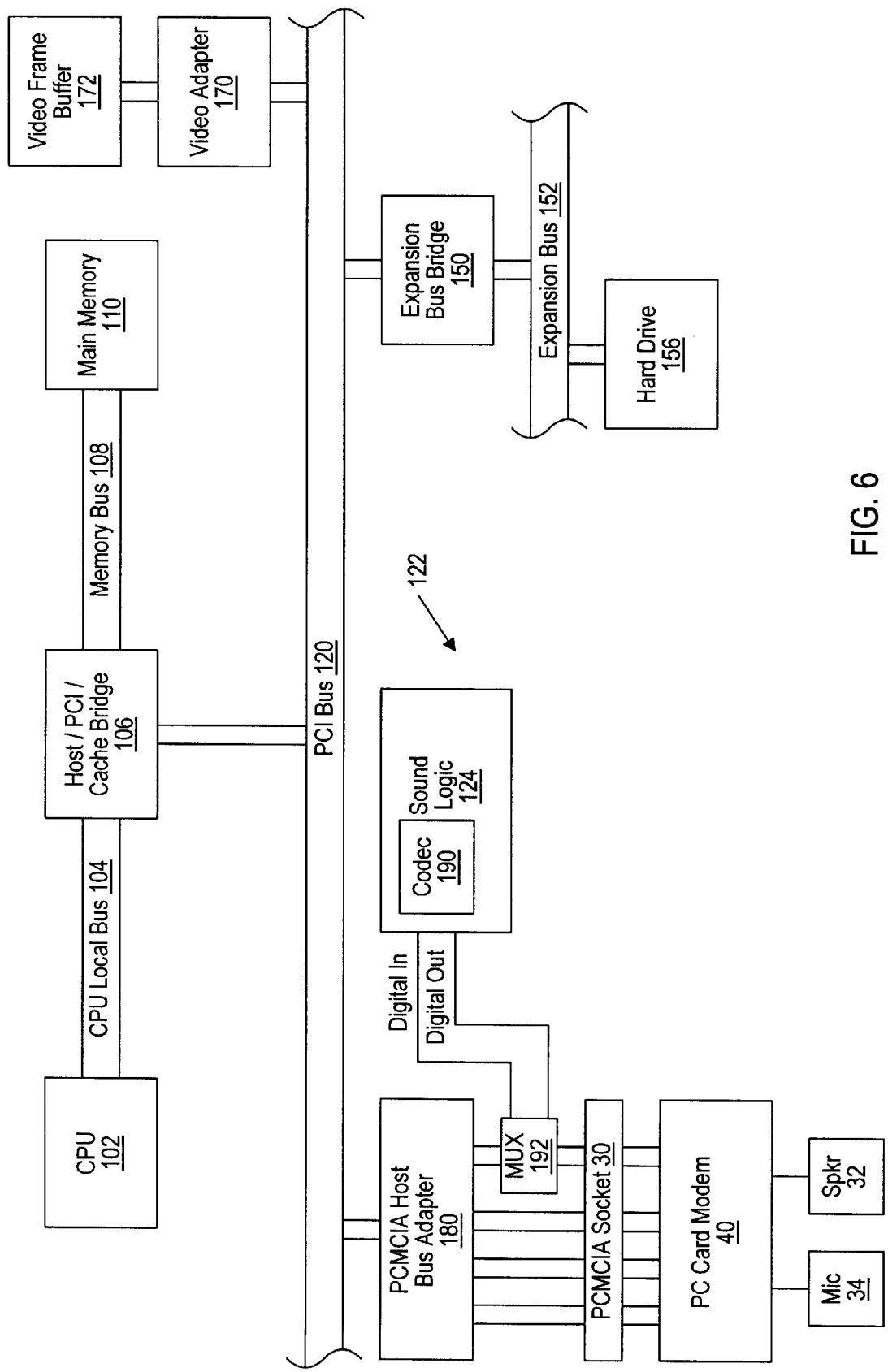
FIG. 6 is a more detailed block diagram of the computer system of FIG. 1 illustrating an embodiment which provides digital audio signal communication between the PC Card socket and the computer's sound system.

Computer System Block Diagram—FIG. 6

Referring now to FIG. 6, a block diagram is shown of computer system 20 incorporating improved digital audio communication between the computer's sound system and the PC Card socket 30 according to the present invention. It is noted that while a digital audio implementation is shown, an analog audio implementation is also contemplated. That is, either digital or analog signals may be provided across the PC Card interface to the PC sound system. Further details regarding the digital audio implementation may be found in U.S. patent application Ser. No. 08/544,054, entitled "Computer System Which Provides Digital Audio Communication Between a PC Card and the Computer's Sound System," filed Oct. 17, 1995; details regarding the analog audio implementation may be found in U.S. patent application Ser. No. 08/496,537 entitled "Computer System Which Provides Analog Audio Communication Between a PC Card and the Computer's Sound System," filed on Jun. 29, 1995. In the preferred embodiment of the invention, the PCMCIA host bus adapter 180 is a PCI bus adapter coupled to the PCI bus. However, it is noted that the PC Card slot may be coupled to any of various types of expansion buses as noted above. Also, the computer system of FIG. 6 is illustrative only, and the present invention may be incorporated into various other systems having various configurations or architectures, as desired.

The embodiment shown in FIG. 6 provides bi-directional communication for digital audio signals between the PC Card 40 and the sound system 122 of the computer system 20. This allows PC Cards which correspond to the PCMCIA electrical specification to include advanced telephony functions, such as telephone answering device functions and full-duplex speakerphone capabilities. It is noted that the present invention may be used to provide bi-directional communication for digital or analog signals, as desired.

As shown, the computer system 20 includes a central processing unit (CPU) 102 which is coupled through a CPU local bus 104 to a host/PCI/cache bridge or chipset 106. The bridge 106 couples through a memory bus 108 to main memory 110. The host/PCI/cache bridge 106 also interfaces to a peripheral component interconnect (PCI) bus 120. In the preferred embodiment, a PCI local bus is used. However, it is noted that other buses may be used.

Various types of devices may be connected to the PCI bus 120, including one or more PC Card bus adapters 180, as desired. In the embodiment shown in FIG. 1, a video adapter 170 and video frame buffer 172 are coupled to the PCI bus 120 for controlling video functions.

A sound system 122 is preferably coupled to the PCI bus 120. The sound system 122 preferably includes sound logic 124, which includes a codec 190 (audio digital coder/decoder), which may also be referred to as a vocoder (voice coder/decoder), which performs analog to digital (A/D) and digital to analog (D/A) functions. The codec 190 may also perform audio compression or decompression functions. The sound logic 124 may also include amplification logic, as well as other logic. In the preferred embodiment, the sound logic 124 includes advanced sound functionality, such as SoundBlaster or SoundBlaster-compatible circuitry, which includes codec or vocoder functionality 190. The sound logic 124 may also include sound functions such as MIDI and wavetable synthesis, among others.

As shown, the speakers 32 are coupled to an output of the PC card modem 40. Also, in the embodiment of FIG. 6, the microphone 34 is coupled to a microphone input of the PC Card modem 40. As discussed above, however, the microphone may be enclosed within the PC Card modem 40. Alternatively, the PC Card modem 40 may be provided with an audio connector or connectors for plugging in a speaker and/or a microphone. In still another embodiment, the cable and connectors used to couple the PC Card modem to the public telephony network may be provided with additional connectors for a speaker and/or a microphone. In each of these embodiments, the PC Card modem may be provided with audio interface circuitry to interface those devices to the computer system.

A PC Card bus adapter 180, also referred to as a PCMCIA bus adapter, is coupled to the PCI bus 120. For more information on an embodiment of PC Card bus adapter 180, please see "PCMCIA System Architecture", referenced above, which is hereby incorporated by reference. PCMCIA socket 30 is connected to the PC Card bus adapter 180. The bus adapter 180 includes logic according to the present invention which interfaces between PC Card 40 and the respective expansion bus 120. Various other devices may be connected to the PCI bus 120, as desired.

Expansion bus bridge logic 150 may be coupled to the PCI bus 120. The expansion bus bridge logic 150 interfaces to an expansion bus 152. The expansion bus 150 may be any of varying types, including the industry standard architecture (ISA) bus, also referred to as the AT bus, the extended industry standard architecture (EISA) bus, or the Micro-Channel architecture (MCA) bus. Various devices may be coupled to the expansion bus 152, including a hard drive 156. It is noted that one or more of the sound system 120 or the PC Card bus adapter 180 may be coupled to the expansion bus 152.

Digital Audio Communication Logic

Referring again to FIG. 6, in the preferred embodiment of the present invention the system includes one or more multiplexers, referred to as multiplexer 192, coupled between one or more pins in the PC Card socket 30 and the sound system 122. In the preferred implementation of this embodiment, the high address line pins of the PC Card socket 30 are used for digital audio signal communication between the PC Card 40 and sound system 122. These embodiments preferably use one or more high address pins, such as address pins 22–25, for digital audio communication. Other address pins, or other pins shown in the pinout of FIG. 5, may be used as desired.

The embodiment of FIG. 6 includes the multiplexer 192 connected to the high address pins of the PC Card socket 30. The multiplexer 192 is also coupled to the PC Card bus adapter 180 and to the sound system 122 as shown. The multiplexer 192 selects either a first path between the one or more high address pins and the PC Card bus adapter 180 or a second path between the one or more high address pins and the sound system 122. In the preferred embodiment, the multiplexer 192 is initially configured to select the first path between the one or more high address pins and the PC Card bus adapter 180. When the PC Card 40 is inserted into the PC Card socket 30, the multiplexer 190 can select the second path between the one or more high address pins and the sound system 122 to provide digital audio communication between the PC Card 40 and the sound system 122.

A means is preferably provided which controls the multiplexer 192 and selects either the first path or the second path. In the preferred embodiment, the means which controls the multiplexer 192 is software which operates the PC Card 40, such as the client drivers 86, or applications software 82, or even the operating system 84. Alternatively, the software which controls the multiplexer 192 is either the client drivers 72, the Card Services 74, or the Socket Services 76. Software can control operation of the multiplexer 192, for example, by writing a bit to a register in the sound logic 124, wherein the register in the sound logic 124 provides a select signal to a select input of the multiplexer 192. Hardware means in the sound system 122 or in other parts of the computer system 20 may also be used to control the multiplexer 192, as desired.

Thus, one or more pins of the PC Card socket 30, preferably one or more high address pins, are connected through respective multiplexers 192 to digital audio inputs and outputs of the sound logic 124. Thus the PC Card modem or terminal adapter 40 generates one or more digital (or analog) audio signals that are provided through one or more of the high address pins of the PC Card socket 30 and through respective multiplexers 192 to the sound logic 124. Also, the sound logic 124 generates one or more digital audio signals that are provided through the respective multiplexers 192 to one or more of the high address pins of the PC Card socket 30 and then to the PC Card 40. It is noted that FIG. 6 only illustrates one digital in signal and one digital out signal to the sound logic 124. However, the computer system may include one or more digital in signals and one or more digital out signals between the PCMCIA socket 30 and the sound logic 124.

In the embodiment of FIG. 6, the microphone 34 is connected to a microphone input of the PC Card modem 40. As noted above, the microphone 34 preferably includes an amplifier. When a user speaks into the microphone 34, the sound is provided to the microphone input of the PC Card modem 40 and is received by the codec 190. The corresponding digital audio signals from the PC Card 40 are provided through the multiplexer 192 to one or more digital audio inputs of the sound logic 124. These digital audio signals are then provided through the sound logic 124, with any desired processing performed on the signal. For example, the codec 190 may receive the digital audio signals, convert them to analog format, and provide the resulting analog signals as output signals to the speakers 32. The signals may then be provided back to the PC Card modem and the connected speakers. Therefore, the speakers 32 generate sound in response to the digital audio signals generated by the PC Card 40. The digital audio signals from the PC Card 40 may also be processed in the sound logic 124 and/or provided to other parts of the computer system. For example, the digital audio signals may be stored in a memory of the computer system.

The sound logic 124 also preferably provides one or more digital audio outputs to the PC Card 40. Thus, when the PC Card 40 is used as a full-duplex speakerphone, and when the user of the computer system is talking to a person at a remote location, the voice signals from the user are provided through the microphone 34 and codec 190 and through the mux 192 and high address pins of the socket 30 to the sound logic 124, processed and then routed to the PC Card modem or terminal adapter 40 and out through a speaker to the respective listeners. It is also noted that the sound logic 124 may multiplex a plurality of digital audio outputs to the PC Card 40. If the user of the computer system desires to place the person on hold and then play music or other audio signals during the time that the person is on hold, software executing on the CPU 102 switches the digital audio output from the sound logic 124, or switches a multiplexer within the sound logic 124, to provide appropriate sound signals from the sound logic 124 to the PC Card modem 40 and then to the person on hold.

CONCLUSION

Therefore, a PC card which includes a PC Card socket and which provides bi-directional digital audio signal communication between the PC Card socket and the sound system of the computer system is shown and described. Speaker and/or microphone functionality are provided to PC Card. The computer system of the present invention thus allows a PC Card modem or ISDN terminal adapter with advanced audio and/or telephony capabilities, such as telephone answering device capabilities, full-duplex speakerphone capabilities, or DSVD capabilities.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A PC Card adapted for insertion in a PC Card slot in a computer system, comprising:

a housing comprising a PC Card adapter, wherein the PC Card adapter includes a plurality of input and output pins for coupling to said PC Card slot and receiving and transmitting signals to said computer system;

a microphone disposed at least partially within said housing, wherein said microphone is adapted for receiving sounds and producing corresponding first audio signals;

audio interface logic coupled to said microphone and disposed within said housing, said audio interface logic configured to process said first audio signals received from said microphone;

a connector attached to said housing and defining an external communication path; and a modem within said housing, coupled to said connector and configured to receive telephony signals on said external communication path and transmit on said external communication path telephony voice data input from said microphone for speakerphone functionality.

2. The PC Card of claim 1, further including a speaker disposed at least partially within said housing and configured to receive second audio signals and to produce sounds corresponding to said second audio signals.

3. The PC Card of claim 1, further including:

telephone answering logic coupled within said housing and operably coupled to said modem and said audio interface logic and configured to receive said telephony signals from said modem and store data corresponding to said telephony signals; and speakerphone logic coupled within said housing to said telephone answering logic and said audio interface logic.

4. The PC Card of claim 3, wherein said connector is an RJ series connector.

5. A PC Card adapted for insertion in a PC Card slot in a computer system, comprising:

a housing comprising a PC Card adapter, wherein the PC Card adapter includes a plurality of input and output pins for coupling to said PC Card slot and receiving and transmitting signals to said computer system;

a speaker disposed at least partially within said housing, wherein said speaker is adapted for receiving first audio signals;

audio interface logic coupled to said speaker and disposed within said housing, said audio interface logic configured to process said first audio signals to said speaker;

a connector attached to said housing and defining an external communication path; and a modem within said housing coupled to said connector and configured to receive telephony signals on said external communication path and provide telephony audio signals to be heard on said speaker for speakerphone functionality.

6. The PC Card of claim 5, further including:

telephone answering logic coupled within said housing and operably coupled to said modem and said audio interface logic and configured to receive said telephony signals from said modem and store data corresponding to said telephony signals; and speakerphone logic coupled within said housing to said telephone answering logic and said audio interface logic.

7. A PC Card adapted for insertion in a PC Card slot in a computer system, comprising:

a housing comprising a PC Card adapter having a plurality of input and output pins for coupling said housing to said PC Card slot and receiving and transmitting signals in said computer system;

a first audio connector attached to said housing and defining a first external communication path through said housing and adapted to receive an external microphone adapter;

audio interface logic disposed within said housing, said audio interface logic configured to process a first signal from a microphone coupled to said first audio connector; and a modem within said housing and configured to receive telephony signals and transmit telephony voice data input from said microphone for speakerphone functionality.

8. The PC Card of claim 7, including a second audio connector attached to said housing defining a second audio communication path through said housing and adapted to receive an external speaker adapter, and wherein said audio interface logic is configured to process a second signal to a speaker coupled to said second audio connector.

9. The PC Card of claim 7, wherein said first audio connector is further adapted to receive an external speaker adapter, and wherein said audio interface logic is configured to process a second signal to a speaker coupled to said first audio connector.

10. The PC Card of claim 8, further including a third connector attached to said housing defining a third external communication path through said housing and adapted to receive a telephone adapter for receiving said telephony signals.

11. The PC Card of claim 10, further including:

wherein said modem is coupled within said housing to receive said telephony signals on said third external communication path;

telephone answering logic coupled within said housing and operably coupled to said modem and said audio interface logic and configured to receive said telephony signals from said modem and store data corresponding to said audio signals; and speakerphone logic coupled within said housing to said telephone answering logic and said audio interface logic and configured to process audio input signals for providing speakerphone capabilities.

12. A PC Card adapted for insertion in a PC Card slot in a computer system, comprising:

a housing comprising a PC Card adapter having a plurality of input and output pins for coupling said housing to said PC Card slot and receiving and transmitting signals in said computer system;

a connector attached to said housing defining an external communication path and configured to receive telephony signals from a telephone source, said connector being further configured to convey first audio signals from an external source;

audio interface logic disposed within said housing, said audio interface logic configured to process said first audio signals from said external source; and a modem within said housing, coupled to said connector and configured to receive said telephony signals on said external communication path and transmit on said external communication path telephony voice data input from said external source for speakerphone functionality.

13. The PC Card of claim 12, wherein said external source is a microphone.

14. The PC Card of claim 12, wherein said connector is further configured to convey second audio signals from said PC Card to an external speaker, and said audio interface logic is configured to process said second audio signals.

15. The PC Card of claim 12, further including:

telephone answering logic affixed within said housing and operably coupled to said modem and said audio interface logic and configured to receive said telephony signals from said modem and store data corresponding to said telephony signals; and speakerphone logic coupled within said housing to said telephone answering logic and said audio interface logic.

16. The PC Card of claim 14, further including:

telephone answering logic affixed within said housing and operably coupled to said modem and said audio interface logic and configured to receive said telephony signals from said modem and store data corresponding to said telephony signals; and speakerphone logic coupled within said housing to said telephone answering logic and said audio interface logic.

17. A PC Card adapted for insertion in a PC Card slot in a computer system, comprising:

a housing comprising a PC Card adapter having a plurality of input and output pins for coupling said housing to said PC Card slot and receiving and transmitting signals in said computer system;

a connector attached to said housing defining an external communication path and configured to receive telephony signals from an external source, said connector being further configured to convey first audio signals to an external speaker;

audio interface logic disposed within said housing, said audio interface logic configured to process said first audio signals to said external source; and a modem within said housing coupled to said connector and configured to receive said telephony signals from an external source and provide telephony audio signals to be heard on said speaker for speakerphone functionality.

18. The PC Card of claim 17, further including:

telephone answering logic affixed within said housing and operably coupled to said modem and said audio interface logic and configured to receive said telephony signals from said modem and store data corresponding to said telephony signals; and speakerphone logic coupled within said housing to said telephone answering logic and said audio interface logic.

19. A PC Card adapted for insertion in a PC Card slot in a computer system, comprising:

a housing comprising a PC Card adapter, wherein the PC Card adapter includes a plurality of input and output pins for coupling to said PC Card slot and receiving and transmitting signals to said computer system;

a modem within said housing and configured to receive telephony signals on an external communication path and transmit telephony voice data on said external communication path;

wherein said PC Card is configured for speakerphone operation in which said telephony voice data transmitted by said modem is derived from a microphone and said telephony signals received by said modem are processed as telephony audio signals to a speaker;

wherein said microphone is coupled within or to said housing.

20. The PC Card of claim 19, wherein said speaker is coupled within or to said housing.

21. The PC Card of claim 19, wherein said modem is configured for digital simultaneous voice and data (DSVD) communications.

22. The PC Card of claim 19, wherein said microphone is disposed at least partially within said housing.

23. The PC Card of claim 19, wherein said speaker is disposed at least partially within said housing.

24. The PC Card of claim 19, wherein said microphone is externally coupled to said housing.

25. The PC Card of claim 19, wherein said speaker is externally coupled to said housing.

26. The PC Card of claim 19, wherein said microphone and said speaker are externally coupled to said housing by a single audio jack.

27. The PC Card of claim 19, further comprising a single connector jack for connecting to said external communication path, said microphone, and said speaker.

28. The PC Card of claim 19, further comprising speakerphone logic configured to provide audio input from said microphone to a sound system of said computer system, wherein said sound system processes said audio input and sends the processed audio input to said modem to be transmitted as said telephony voice data on said external communication path.

29. A method for providing speakerphone functionality through a PC Card, comprising:

providing audio input from a microphone coupled to or within the PC Card to speakerphone logic within said PC Card;

said speakerphone logic sending the audio input through a PC Card adapter to a sound system of a computer system in which the PC Card is inserted;

said sound system processing the audio input into voice data and sending said voice data to a modem within said PC Card;

said modem transmitting said voice data onto an external telephony communication path;

said modem receiving telephony audio data from said external telephony communication path; and providing an audio signal derived from said telephony audio data to a speaker.

30. The method of claim 29, further comprising said PC Card performing simultaneous voice and data communications.

* * * * *